United States Patent [19]

Janesick et al.

[11] Patent Number: 4,822,748
[45] Date of Patent: Apr. 18, 1989

[54] PHOTOSENSOR WITH ENHANCED QUANTUM EFFICIENCY

[75] Inventors: James R. Janesick, La Canada; Stythe T. Elliott, Sun Valley both of Calif.

[73] Assignee: California Institute of Technology, Pasadena, Calif.

[21] Appl. No.: 88,678

[22] Filed: Aug. 24, 1987

Related U.S. Application Data

[63] Continuation-in-part of Ser. No. 642,417, Aug. 20, 1984, abandoned.

[51] Int. Cl.$^4$ .................... H01L 31/00; H01L 31/14; H01L 31/16
[52] U.S. Cl. ......................................... 437/3; 437/53; 437/173; 250/370.14; 250/371; 250/372; 357/24; 357/30
[58] Field of Search ............... 437/53, 173, 3, 239; 250/372, 578, 370.01, 370.09, 370.14, 370.15, 371; 357/24, 29, 30, 55

[56] References Cited

U.S. PATENT DOCUMENTS

| | | | |
|---|---|---|---|
| 4,040,092 | 8/1977 | Carnes | 358/213 |
| 4,266,334 | 5/1981 | Edwards et al. | 437/3 |
| 4,276,099 | 6/1981 | Keen et al. | 437/53 |
| 4,760,031 | 7/1988 | Janesick | 437/3 |

OTHER PUBLICATIONS

Ghandhi, *VLSI Fabrication Principles*, Wiley and Sons, New York, NY (1983), pp. 385–387.
Bhatia et al., IBM Tech. Disc. Bull., vol. 15, No. 3 (Aug. 1972), pp. 723–724.

Primary Examiner—Olik Chaudhuri
Attorney, Agent, or Firm—Freilich, Hornbaker, Rosen & Fernandez

[57] ABSTRACT

A method to significantly increase the quantum efficiency (QE) of a CCD (or similar photosensor) applied in the UV, far UV and low energy x-ray regions of the spectrum. The increase in QE is accomplished by overthinning the backside of a CCD substrate beyond the epitaxial interface and UV flooding the sensor prior to use. The UV light photoemits electrons to the thinned surface and charges the backside negatively. This in turn forms an accumulation layer of holes near the Si-SiO$_2$ interface creating an electric field gradient in the silicon which directs the photogenerated signal to the frontside where they are collected in pixel locations and later transferred. An oxide film, in which the backside charge resides, must have quality equivalent to a well aged native oxide which typically takes several years to form under ambient conditions. To reduce the amount of time in growing an oxide of sufficient quality, a process has been developed to grow an oxide by using deionized steam at 95° C. which takes less than one hour to grow.

5 Claims, 8 Drawing Sheets

PHOTOSENSOR WITH ENHANCED QUANTUM EFFICIENCY

ORIGIN OF INVENTION

The invention described herein was made in the performance of work under a NASA contract and is subject to the provisions of Section 305 of the National Aeronautics and Space Act of 1958, Public Law 85-568 (72 Stat. 435: 42 USC 2457).

This is a continuation-in-part of application Ser. No. 06/642,417 filed Aug. 20, 1984 now abandoned. This continuation-in-part is for the purpose of dividing out of the original application nonelected claims, and to add new matter and claims directed to the method of growing an oxide film on the backside of thinned backside-illuminated sensors.

FIELD OF THE INVENTION

This invention relates to photo sensors, and more particularly to improvements in the performance of thinned backside-illuminated CCDs for blue, ultraviolet, far ultraviolet, and low energy x-ray wavelengths.

BACKGROUND OF THE INVENTION

Charge coupled devices (CCDs) are the detectors of choice for a large number of terrestrial astronomical applications in the visible and near infrared, where high sensitivity and low noise are the important considerations. In addition to terrestrial use, such devices are now being (or will soon be) flown on several spaceborne satellites and missions. In 1976, CCDs were selected as the detectors for the Hubble Space Telescope (HST) Wide Field/Planetary Camera (WF/PC). CCDs also are the detectors selected for the camera on the Giotto Mission to Halley's Comet, the Solid State Imager (SSI) on the Galileo Orbiter, and for the solar imaging cameras for the Shuttle-based Solar Optical Telescope (SOT) mission. Both Galileo and Giotto are visible imaging missions, while the devices for the SOT mission require response into the ultraviolet (UV), and the devices for WF/PC require response shortward to Lyman-$\alpha$ ($\lambda = 1216$ Å). For these latter devices, the UV response was enhanced by using an evaporated organic phosphor film coating (coronene) which converts UV photons to the visible.

In the past several years there has been a surge of interest in the areas of UV, XUV, and x-ray instruments, imaging, and astronomy. This interest, coupled with an unexpected short wavelength instability of the quantum efficiency of the thinned backside illuminated CCDs used by WF/PC, has stimulated a detailed investigation of the short wavelength response ($1 \text{ Å} < \lambda < 5000 \text{ Å}$) and performance potential of the CCD as a detector for this spectral region. It has now been demonstrated that uncoated devices are useful detectors with potential to achieve very high quantum efficiencies over the entire spectral range of 1 to 11,000 Å, (i.e., from the soft x-ray to the near IR).

The fundamental parameters which ultimately determine CCD performance are:
(1) Read Noise
(2) Charge Transfer Efficiency (CTE)
(3) Quantum Efficiency (QE)
(4) Charge Collection Efficiency (CCE)

At the present stage of development, it is now possible to consistently fabricate CCDs which have low read noise (in the 4 to 15 e$^-$ range) and excellent CTE performance ($>0.99999$). The means of achieving high QE and CCE, of which the CCD is capable, is the subject of this application.

As will be described more fully hereinafter, the present invention utilizes backside illumination of any thinned CCD, whether it be four-phase, three-phase, two-phase, uniphase or virtual-phase in a manner which yields theoretical quantum efficiency performance for blue, ultraviolet, far ultraviolet and low energy x-ray wavelengths. However, the specific embodiment to be described herein by way of example, and not by way of limitation, utilizes the three-phase CCD.

SUMMARY OF THE INVENTION

In accordance with one aspect of the present invention, a method is provided to promote quantum efficiency of a CCD imaging sensor for blue, ultraviolet, far ultraviolet and low energy x-ray wavelengths, comprised of the steps of overthinning the backside to remove all low resistivity substrate material into the high resistivity silicon, and subjecting the backside of the overthinned detector to an intense flood of ultraviolet radiation prior to using the sensor for imaging. The ultraviolet flooding preconditions the CCD for imaging yielding very high quantum efficiency for an extended period (years) of use if operated at a very low temperature, such as at nitrogen cooled temperature of $-130°$. The UV flood eliminates a "dead region" which is 6000 Å in extent in the form of an unwanted backside depletion well created by positive states at the Si-SiO$_2$ interface which result after thinning. During the process of UV flooding, electrons are photoemitted from the silicon into trapping centers on the immediate SiO$_2$ surface charging the backside negatively causing the backside potential well and dead region to collapse. An accumulation layer of holes near the Si-SiO$_2$ interface within the silicon creates an electric field gradient which directs photogenerated signal carriers to the frontside increasing the quantum efficiency of the CCD.

The SiO$_2$ layer which has the required characteristics (thickness and quality equivalent to or better than native oxide) which supports the backside charge and used in accumulating the backside illuminated CCD for QE enhancement can be quickly grown after thinning in about an hour (as compared to as much as two years or more for a mature native oxide) by exposing the backside of the sensor in a deionized steam at 95° C. after preparing the backside in accordance with the first part of this invention.

The novel features of the invention are set forth with particularlity in the appended claims. The invention will best be understood from the following description when read in conjunction with the attached drawings.

DESCRIPTION OF PREFERRED EMBODIMENTS

Before describing in detail preferred embodiments of the invention with reference to FIG. 1, additional backgroud information will first be given on thinned backside illuminated CCD structures with reference to FIGS. 2(a), (b) and (c).

Figure 1:
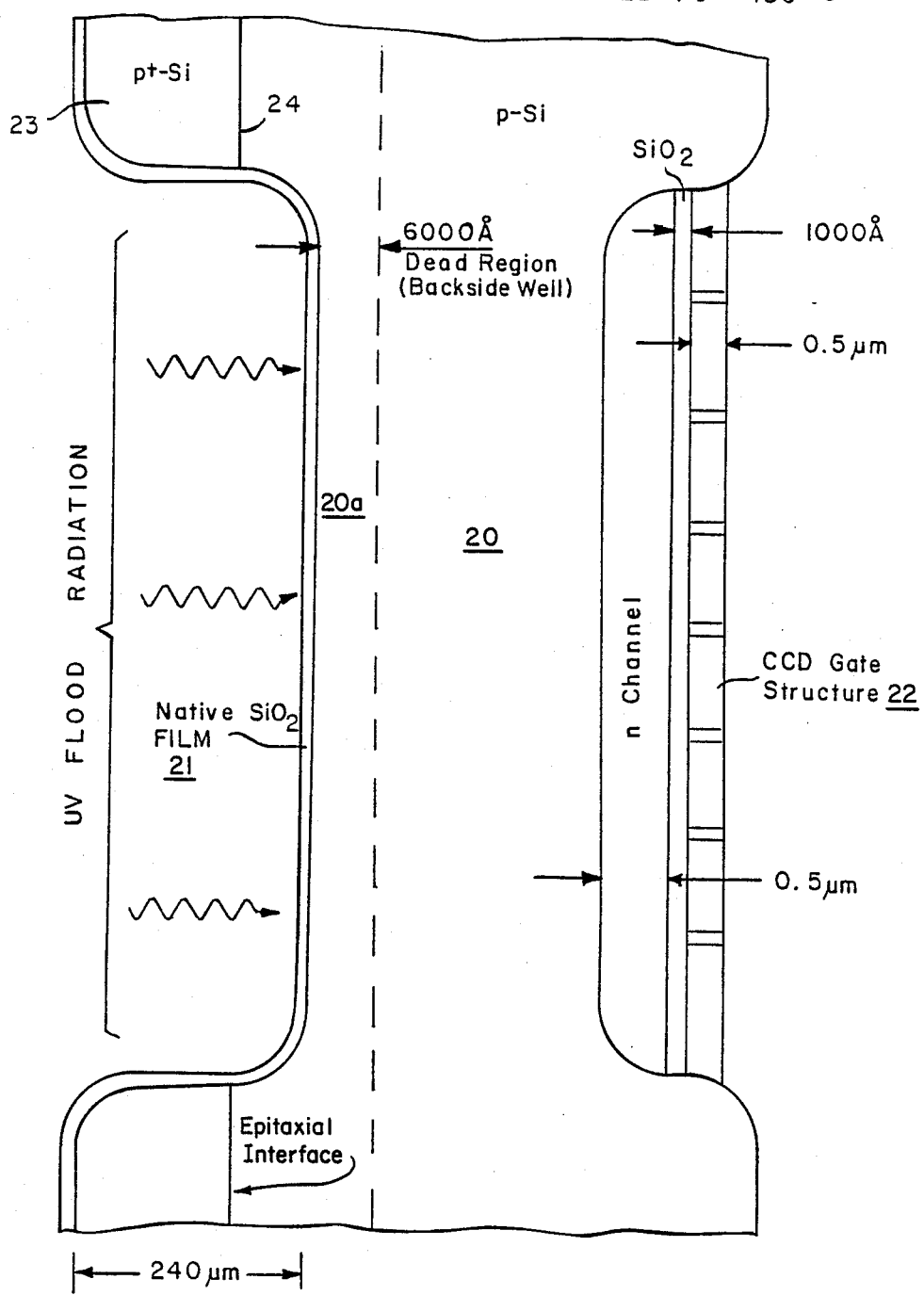
FIG. 1 illustrates schematically a buried channel CCD with an overthinned backside beyond the epitaxial interface subjected to intense UV radiation flooding yielding maximum quantum efficiency in accordance with one aspect of this invention.

Referring to FIG. 1, the photosensitive volume of a backside illuminated CCD is a layer of highpurity silicon 20, bounded on one side by an oxide layer 21, and gate structure 22, and on the other side by a thinned region 20a etched through a thick, low lifetime p+ substrate 23 on which the device is fabricated.

For photons with long absorption lengths (i.e., wavelengths less than 10 Å or greater than 7000 Å), the quantum efficiency (QE) depends largely on the thickness of the photosensitive volume 20. (Quantum efficiency is the ratio of the number of electrons per pixel per second to the number of incident photons per pixel per second, which has units of electrons per incident photon.) Intermediate wavelengths have relatively short absorption lengths in silicon and silicon dioxide and, throughout this spectral region, the QE depends largely on the transparency and reflective properties of the layers that bound the photosensitive volume.

Figure 2A:
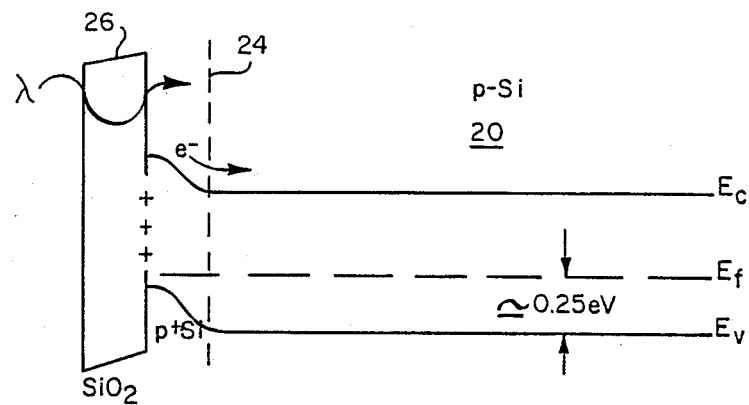
FIGS. 2(a), (b) and (c) illustrate the conduction and valence bands within the silicon region of a thinned, overthinned and underthinned CCD.

For optimum QE, the substrate of a CCD is thinned to allow direct backside illumination of the sensitive layer 20, as illustrated schematically in FIG. 2(a). In the thinning process used in the past, an accumulation layer of p+ boron-doped silicon was intentionally left at the back surface to establish a field which aids the collection of charge. This results in an increase in QE in the 10 to 7000 Å range. The response throughout this range is a strong function of the surface condition and of the p+ boron accumulation profile. Ideally, thinning to the proximity of the $p^{30}$-p boundary 24 between the sensitive epitaxial p layer and the substrate will result in optimum backside illumination characteristics by providing the proper electric field gradient for directing signal charge to the frontside potential wells. There will always be an oxide film 26 formed on the surface of the thinned (etched) substrate by atmospheric oxidation of the etched surface following the process of removing etchant.

Figure 2B:
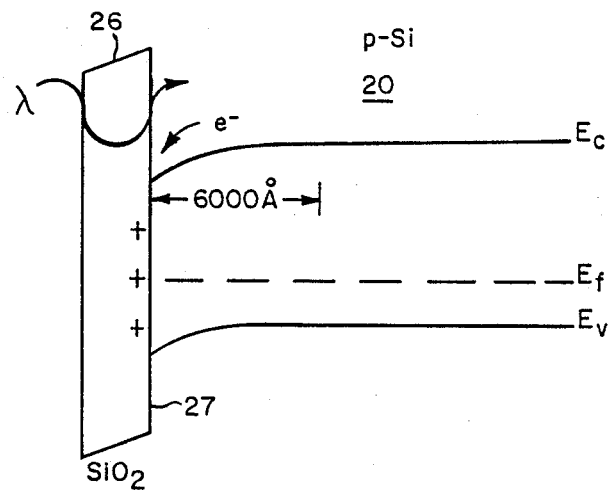
Figure 2C:
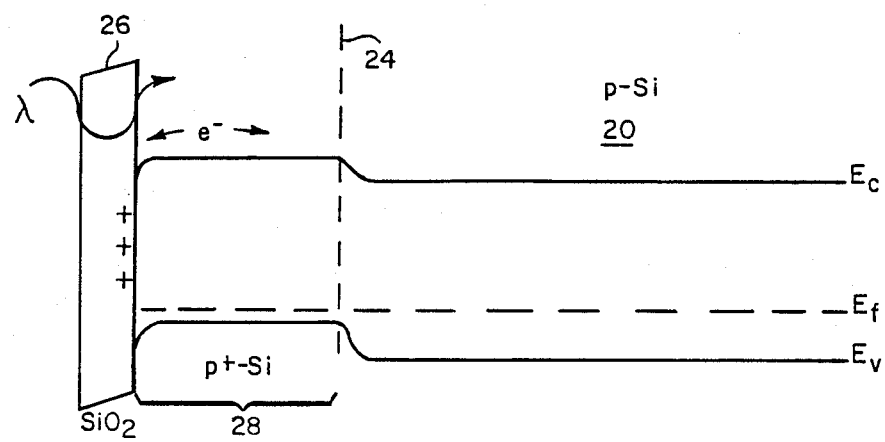

Overthinning into the sensitive epitaxial p layer 20, as shown in FIG. 2(b), will yield low responsivity in this wavelength range because the energy bands are bent downward by the positive trapped charge always found at the Si-SiO$_2$ interface 27. This downward band bending creates an unwanted backside potential well in a dead region (i.e., a depletion region) of approximately 6000 Å in depth. Electrons produced by photons penetrating less than 6000 Å will collect in this backside well and be lost through recombination at the Si-SiO$_2$ interface 27. Conversely, an excessively thick layer 28 of p+ material shown in FIG. 2(c) will yield a low response due to recombination of short-lived minority carriers in the p+ material. Therefore, an optimum boron profile exists that most effectively directs carriers away from the back surface without permitting substantial carrier recombination. This optimum p+ layer is impossible to achieve in practice due to nonuniform thinning of the chip. (Absolute thinning accuracies of better than 2000 Å are required to produce devices that behave uniformly.)

A simple method has been discovered to promote backside accumulation of a CCD structured as shown in FIG. 1, i.e., without the p+ boron layer 28, by overthinning the backside as shown in FIG. 2(b). It has been found that if the overthinned CCD is subjected to an intense flood of UV radiation, as indicated schematically in FIG. 1, a very high and uniform blue response can be achieved over the array.

Figure 3:
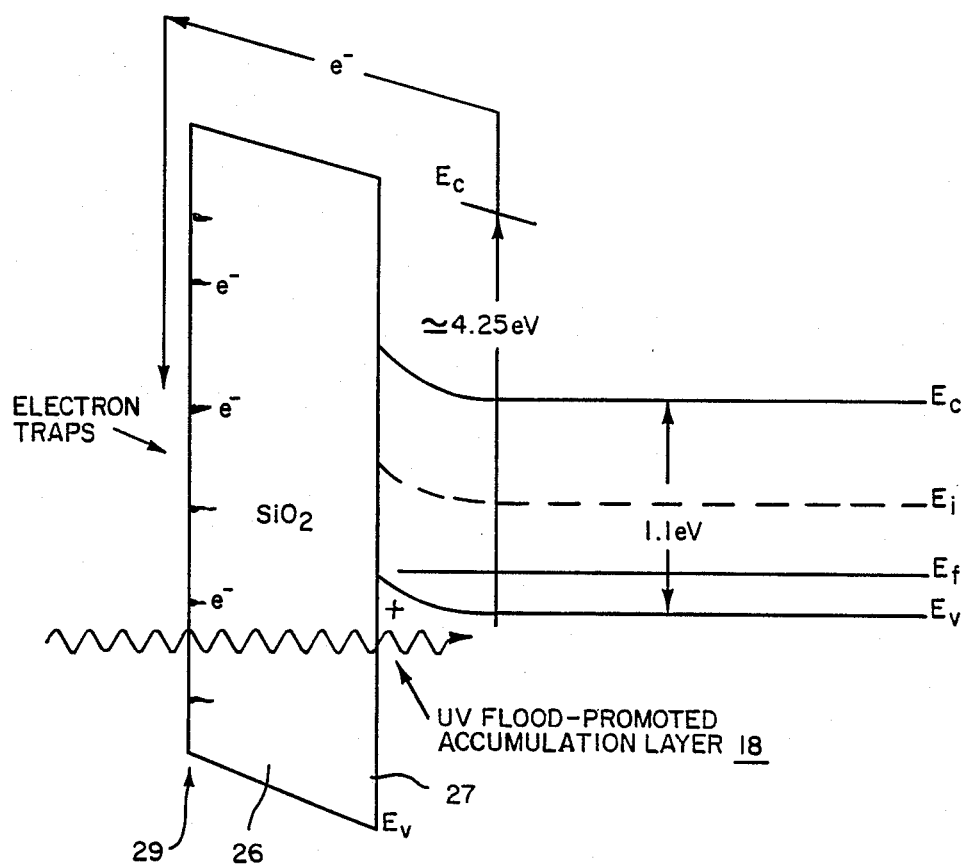
FIG. 3 illustrates the conduction and valence bands of an overthinned CCD subjected to intense UV flooding in accordance with one aspect of this invention.

The mechanism proposed to explain this blue enhancement is now discussed with reference to FIG. 3. Ultraviolet light causes photoemission of electrons from the valence band of the sensitive p epitaxial layer 20 into the conduction band of the adjacent SiO$_2$ film 26, charging the backside negatively. This causes the backside potential well shown in FIG. 2(b) to collapse, i.e., and produces an accumulation layer 18 of holes as shown in FIG. 3. In this condition, signal photoelectrons can proceed from the backside to the frontside without loss to a backside well.

Figure 4:
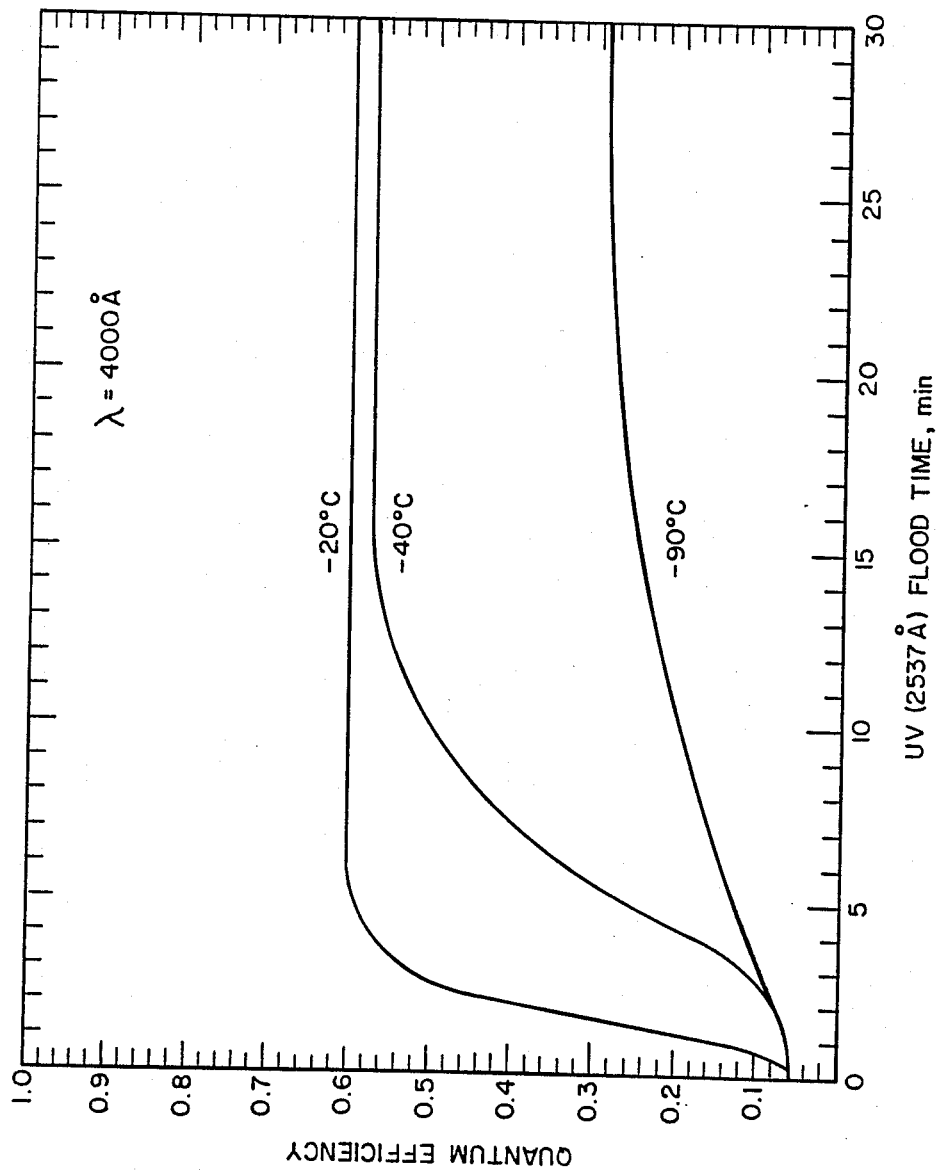
FIG. 4 is a plot of quantum efficiency as a function of UV flood time at different operating temperatures for a wavelength of 4000 Å.

The backside charging process can be monitored by measuring the QE at 4000 Å as a function of UV flood time, as shown in FIG. 4. Since roughly 40% of 4000-Å light is lost due to reflection at the silicon surface of the device, FIG. 4 shows that UV flooding technique achieves the full theoretical performance expected at this wavelength.

Figure 5:
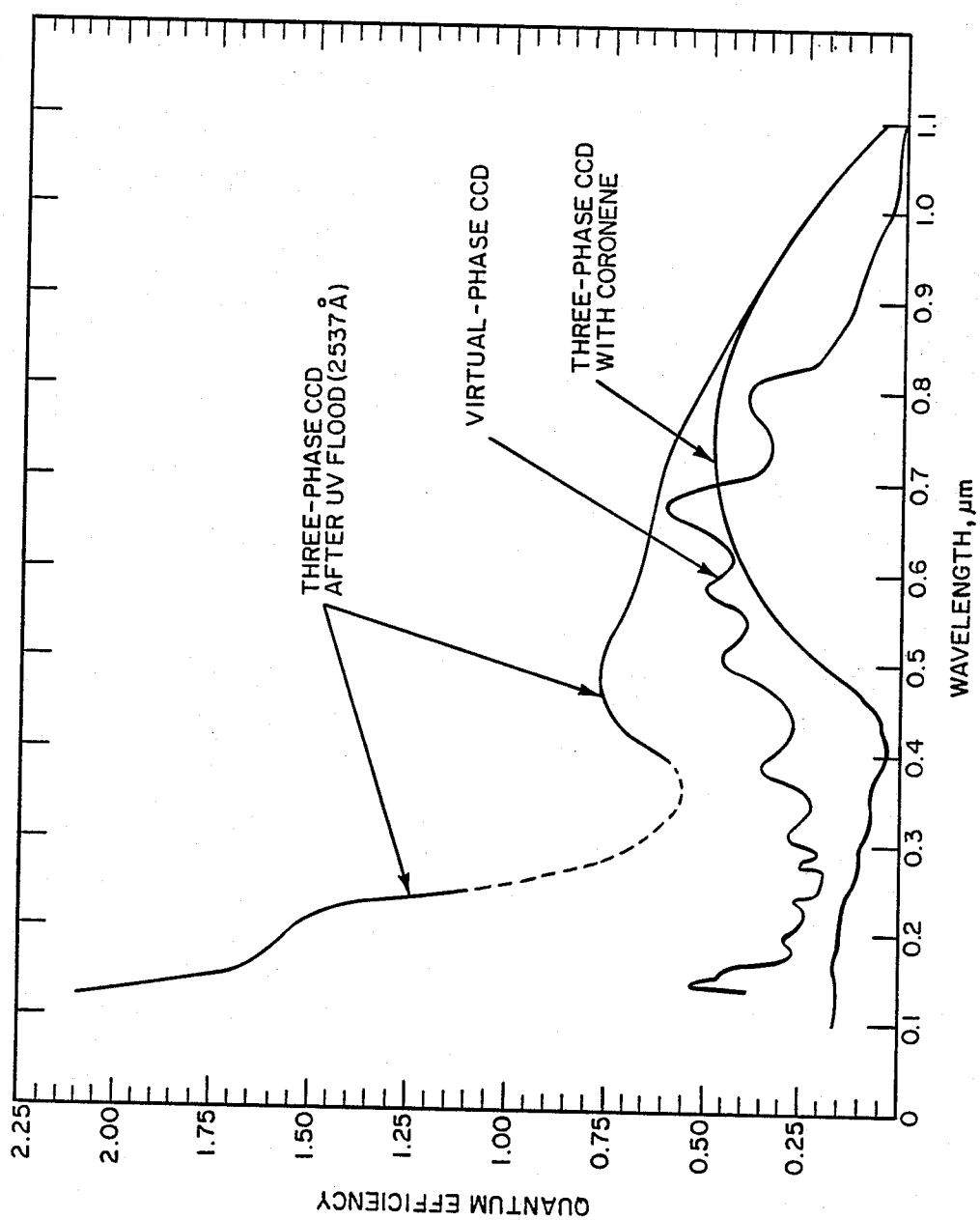
FIG. 5 compares three-phase CCD quantum efficiency at various wavelengths as a function of wavelength after UV flooding with a three-phase CCD with coronene coating and with a virtual-phase CCD.

The improvement in QE is even more dramatic for shorter wavelengths. FIG. 5 shows the QE for a three-phase CCD after backside UV illumination. For comparison, the QE of a three-phase CCD with coronene coating and a frontside-illuminated virtual-phase CCD are also presented. Here the backside-illuminated sensor, which yields a QE of greater than 200%, is far superior to the coronene-coated device. The dramatic increase in QE for wavelengths shortward of 3000 Å is due to multiple e-h pair generation per photon and a decrease in backside reflectivity.

Figure 6:
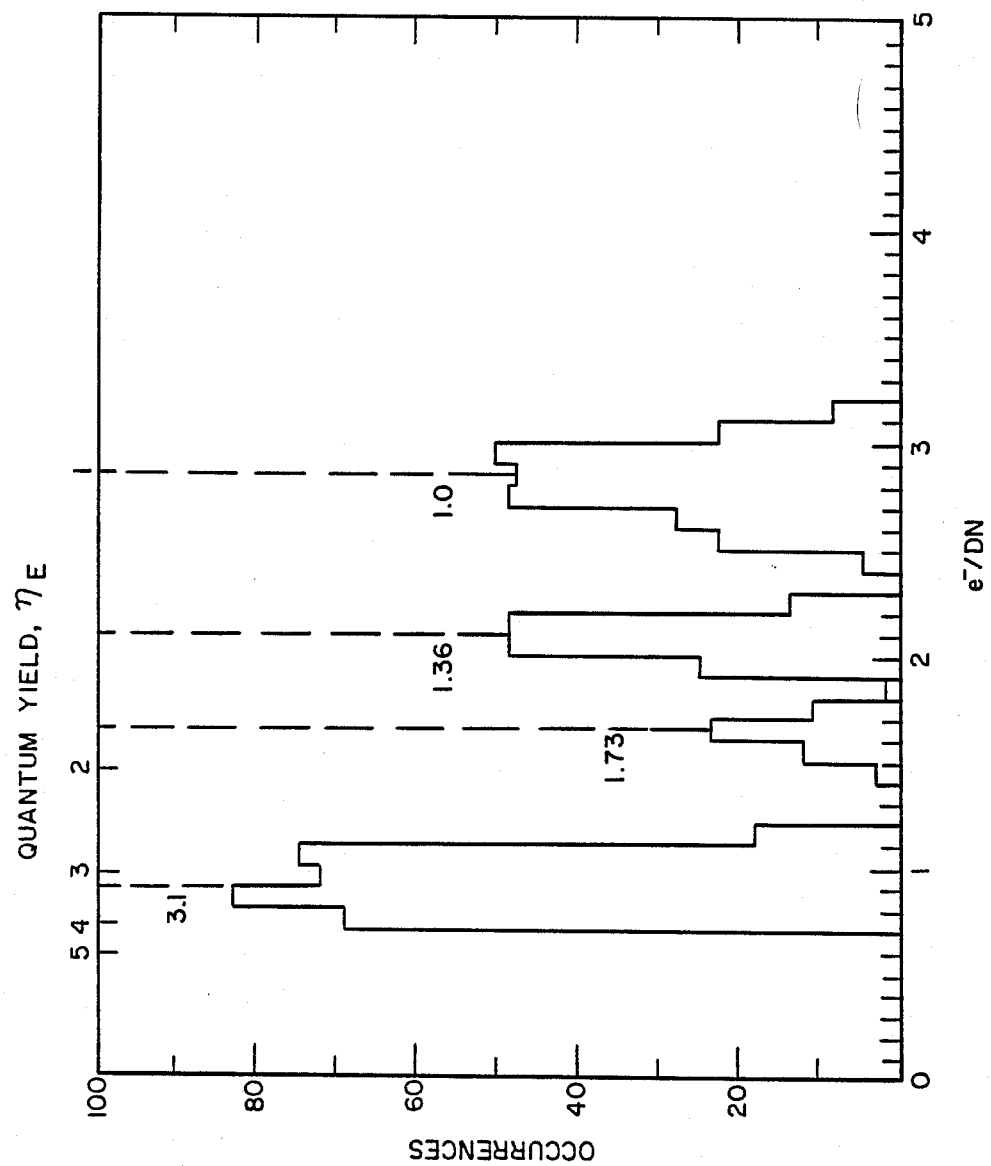
FIG. 6 shows the quantum yield (electrons generated/interacting photon) for a 100×100 pixel subarea within a corner of a three-phase CCD after backside flooding with UV. Overthinning produces a high quantum yield (3.1), while not thinning through the epitaxial interface produces less quantum yield (1.0 to 1.73), depending upon the thickness of substrate material left.

This finding is supported further by measurement of the quantum yield (electrons produced per interacting photon). FIG. 6 shows the quantum yield for a 100×100 pixel subarea at 1216 Å within a corner of a three-phase CCD after backside charging with UV light flood. Several different yields are observed, which have been correlated to regions of different boron accumulation layer thicknesses caused by uneven thinning. A low quantum yield is measured where the device is thick and recombination is high due to the p+ layer 23. Areas thinned through the p+ layer show very uniform UV response and near-theoretical quantum yield (3 e−/photon). It can be concluded at this wavelength that each photon charge packet (3 e⁻) remains intact without recombination loss.

As FIG. 3 shows, 4.25 eV of energy is required to cause photoemission of electrons from the valence band of silicon into the conduction band of SiO$_2$; therefore, backside charging can only be achieved using wavelengths below 2915 Å. A light flood using 2537 Å (mercury lamp) has 0.7 eV more energy than is required for this process and works very well at room temperature. Charging at colder temperatures significantly increases the required UV flood time, and below −40° C. full charging cannot be usually achieved at 2537 Å (see FIG. 5). This effect has been attributed to a lack of additional thermal (kT) energy needed by the electrons to overcome the potential barrier of the SiO$_2$, which increases as the backside charges. It should be mentioned that corona discharge and nitrogen monoxide charging have been used successfully to provide full charging at cryogenic temperatures and offers advantages over UV flooding for some applications.

Figure 7:
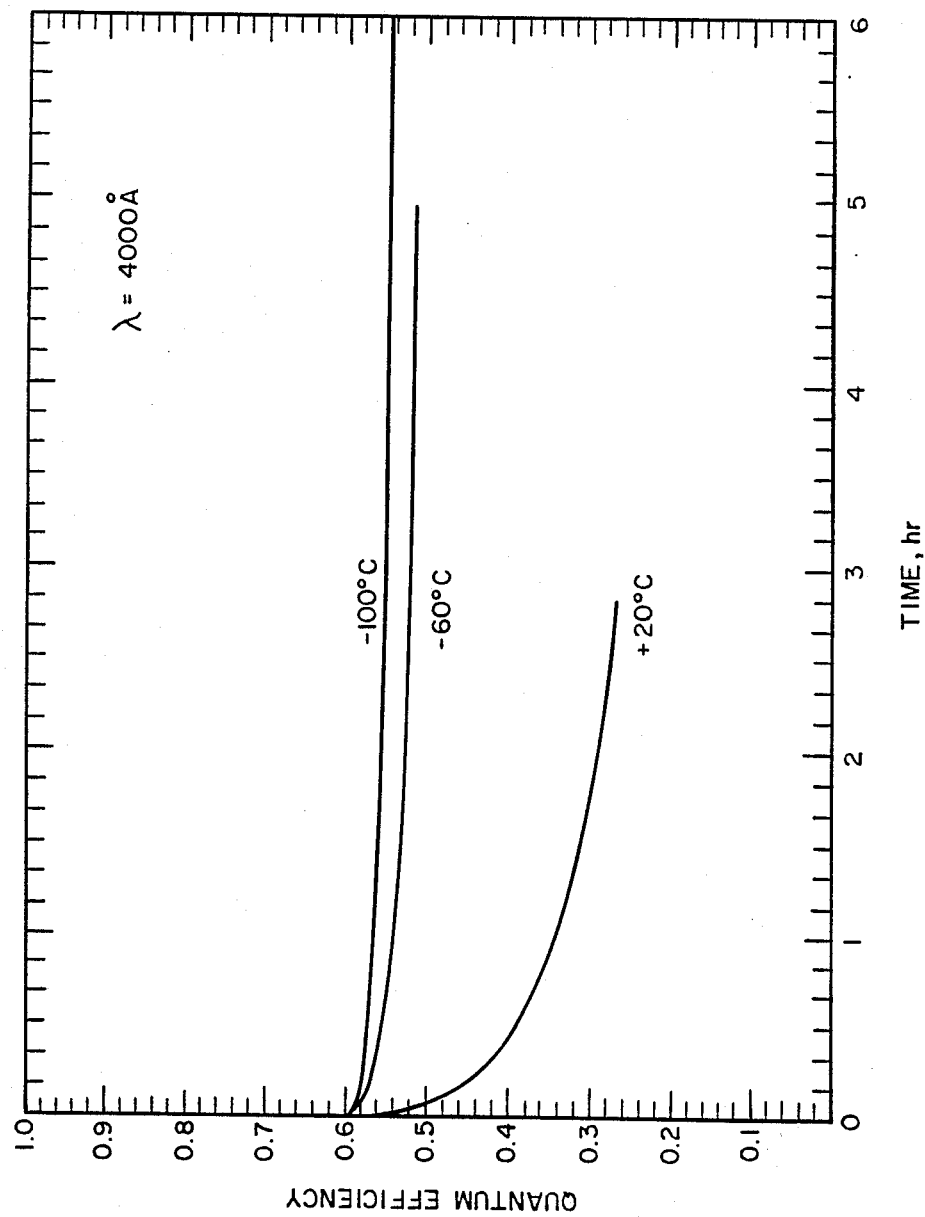
FIG. 7 is a graph of quantum efficiency at 4000 Å as a function of operating time for temperatures +20° C., −60° C. and −100° C.

Stability of QE produced by backside charging is chiefly dependent on temperature. FIG. 7 shows QE at 4000 Å as a function of operating time for temperatures of +20°, −60°, and −100° C. The characteristics shown are attributed to the discharge of electrons from SiO$_2$ traps at higher temperatures. Thus operation at the lower temperatures results in improved stability, and it has been shown that very long-term stability (years) can be achieved at a temperature of −130° C. Most users of this innovation usually charge their CCDs just before use as a matter of standard practice.

The backside discharge rate has been found to increase with humidity. Therefore, to assure stable QE, this problem can be eliminated by housing the CCD in a dry environment (e.g., N$_2$ or vacuum).

After overthinning, as that term is defined with reference to FIG. 2(b) an oxide film is required to hold the backside charge when UV flooded. This oxide film can be produced as a natural consequence of long exposure to oxygen and water in the atmosphere, such as exposure over a period as long as two or more years. Such a naturally produced oxide film, called native oxide, has been used successfully in promoting the quantum efficiency of a CCD imaging sensor for blue, ultraviolet, far ultraviolet and low energy x-ray wavelengths, but it increases the time necessary to fabricate devices from a few months to a few years which is an unacceptable delay.

Figure 8:
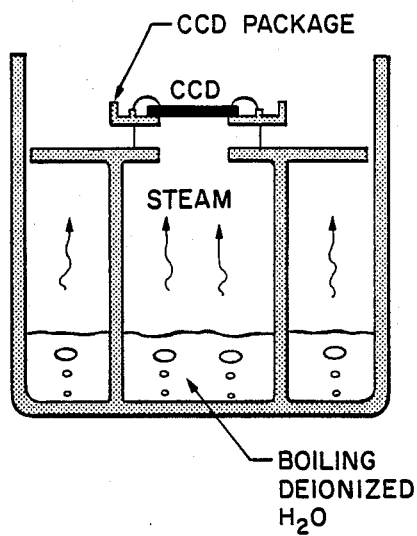
FIG. 8 illustrates apparatus used in growing flash oxide onto the backside of a device in accordance with the present invention.

To shorten this time an oxide film is grown in about one hour on the surface of a device in the presence of deionized vapor at 95° C. as shown in FIG. 8. This one hour is insignificant when compared with the overall fabrication time of about three months for a complex device, such as a CCD. Also the oxide film grown has fewer positive charges than a native oxide, such as fewer Na$^+$ charges, a contaminating source which develops during a native oxide growth, and is of better quality, i.e., has fewer Si-SO$_2$ interface states to be discussed below.

This oxide film far exceeds the requirements of the technique for enhancing the quantum efficiency of a photo sensor, and may be used not only with backside charging, as described above, but also with a metal gate over the oxide film as described in a copending application Ser. No. 06/835,535 titled "CCD Imaging Sensor with Flashed Backside Metal Film," assigned to the assignee of the present invention. There an unbiased metal film over the oxide film permanently promotes backside charging, thus obviating the need to periodically flood the backside with UV radiation.

Referring to the quality of the oxide film, a feature more important than its thickness, it is necessary that the number of positive charges within the oxide film be minimized. These positive charges are of three kinds (sources), namely (1) Mobile charge, $Q_m$, such as positively charged sodium, Na$^+$, which builds up as the oxide grows: a contaminant source.

(2) Trapped charge, $Q_t$, similar to mobile charge, but spatially fixed near the Si-SiO$_2$ interface.

(3) Interface charge, $Q_{it}$, which is caused by "dangling" bonds located at the Si-SiO$_2$ interface which occur when the Si lattice is abruptly terminated along a given plane to form a surface.

Minimizing the number of positive charges within the oxide is important to its quality. This is because the positive charges "tie-up" with the negative charges produced by backside UV flood charging or the flash gate as opposed to the free holes which make up the accumulation layer in the p-silicon that produces an electric field at the surface which sweeps signal electrons to the frontside where they are collected: i.e., the voltage drop across the silicon decreases as the number of positive oxide charges increase, lowering the overall QE of the CCD.

Although particular embodiments of the invention have been described and illustrated herein, it is recognized that modifications and variations may readily occur to those skilled in the art. Consequently, it is intended that the claims be interpreted to cover such modifications and variations.

What is claimed is:

1. A method of improving the quantum efficiency of a charge-coupled-device image sensor having an array of pixels and charge transfer gates for reading out image charges from wells of said array of pixels in a layer of photosensitive semiconductor material produced on a substrate material, where the quantum efficiency is improved for blue, ultraviolet, far ultraviolet and low energy x-ray wavelengths comprised of the steps of overthinning the backside of said charge-coupled-device image sensor to remove all substrate material, and covering the overthinned backside with a thin oxide film, thereby leaving a depletion region just under said thin oxide film over said overthinned photosensitive semiconductor material as a result of thinning, and flooding the backside of said thinned photosensitive semiconductor material with intense ultraviolet radiation prior to using said charge-coupled-device imaging sensor thereby producing an accumulation layer of holes to greatly increase the quantum efficiency of said charge-coupled-device imaging sensor.

2. A method as defined in claim 1 wherein said photosensitive semiconductor material is p-doped silicon epitaxially grown on a p$^+$ substrate, and overthinning is carried out beyond the epitaxial interface between said substrate and said photosensitive semiconductor material, and wherein said backside flooding with ultraviolet photons produces photoemitted electrons that migrate to said oxide film where electron traps capture the migrating electrons to build up a negative charge on the surface of said oxide film, thereby promoting valence and conduction band within the silicon bending from a downward to an upward direction from the innermost part of said depletion region to said thin oxide film and an accumulation of holes at the interface of the oxide with the p-doped silicon, thereby causing unwanted backside potential wells to collapse.

3. A method as defined in claim 2 wherein said photosensitive semiconductor material is thinned to about 8 to 10 μm of said epitaxial material.

4. A method as defined in claim 1 wherein said thin oxide film is produced as a natural consequence of long exposure to oxygen and water in the atmosphere to produce a native oxide.

5. A method as defined in claim 1 wherein said thin oxide film is grown in about one hour in the presence of deionized water maintained at about 95° C.

* * * * *